(12) United States Patent
Niu et al.

(10) Patent No.: US 8,111,670 B2
(45) Date of Patent: Feb. 7, 2012

(54) SYSTEM AND METHOD FOR PROCESSING WIRELESS HIGH DEFINITION VIDEO DATA USING REMAINDER BYTES

(75) Inventors: Huaning Niu, Sunnyvale, CA (US); Pengfei Xia, Mountain View, CA (US); Chiu Ngo, San Francisco, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 793 days.

(21) Appl. No.: 11/863,084

(22) Filed: Sep. 27, 2007

(65) Prior Publication Data
US 2008/0225818 A1 Sep. 18, 2008

Related U.S. Application Data

(60) Provisional application No. 60/906,382, filed on Mar. 12, 2007.

(51) Int. Cl.
*H04B 7/216* (2006.01)
*H04N 11/04* (2006.01)

(52) U.S. Cl. ............... 370/335; 375/240.01; 370/342

(58) Field of Classification Search .............. 370/310, 370/328, 329, 335, 342; 375/262
See application file for complete search history.

(56) References Cited

U.S. PATENT DOCUMENTS

| | | | |
|---|---|---|---|
| 4,907,233 A | 3/1990 | Deutsch et al. | |
| 5,337,087 A | 8/1994 | Mishima | |
| 5,508,752 A | 4/1996 | Kim et al. | |
| 6,717,908 B2 | 4/2004 | Vijayan et al. | |
| 6,724,327 B1 | 4/2004 | Pope et al. | |
| 7,133,441 B1 | 11/2006 | Barlev et al. | |
| 7,388,915 B2 | 6/2008 | Cho et al. | |
| 7,499,462 B2* | 3/2009 | MacMullan et al. | 370/401 |
| 7,610,457 B2* | 10/2009 | Lee | 711/157 |

(Continued)

FOREIGN PATENT DOCUMENTS

EP 0537932 A2 4/1993

(Continued)

OTHER PUBLICATIONS

Notice of Allowance for U.S. Appl. No. 11/863,109 dated Nov. 6, 2009.

(Continued)

*Primary Examiner* — Chi Pham
*Assistant Examiner* — Robert Lopata
(74) *Attorney, Agent, or Firm* — Kenneth L. Sherman, Esq.; Michael Zarrabian, Esq.; Myers Andras Sherman & Zarrabian LLP

(57) ABSTRACT

A method and system for processing high definition video data using remainder bytes is disclosed. In one embodiment, the method includes receiving an information packet having the length of L bytes, wherein $L=(M \times n \times K)+A$, and where: M is the depth of an interleaver, n is the number of interleavers, K is an encoding code length and A is the number of remainder bytes with respect to $M \times n \times K$ bytes, wherein the remainder bytes are located at the end of the information packet, and wherein $M \times n \times K$ bytes represent $M \times n$ codewords. The method further includes converting the A remainder bytes into a plurality of shortened codewords, wherein each of the shortened codewords is shorter in length than each of the $M \times n$ codewords. At least one embodiment of the invention provides much lower padding efficiency while improving the decoding performance.

25 Claims, 12 Drawing Sheets

U.S. PATENT DOCUMENTS

| | | | |
|---|---|---|---|
| 7,965,837 | B2 | 6/2011 | Kawasaki et al. |
| 2004/0047424 | A1 | 3/2004 | Ramaswamy et al. |
| 2004/0064782 | A1 | 4/2004 | Lerner et al. |
| 2005/0047519 | A1 | 3/2005 | Kim et al. |
| 2005/0156761 | A1 | 7/2005 | Oh |
| 2005/0220180 | A1 | 10/2005 | Barlev et al. |
| 2006/0005106 | A1 | 1/2006 | Lane et al. |
| 2006/0082274 | A1 | 4/2006 | Song |
| 2006/0107171 | A1 | 5/2006 | Skraparlis |
| 2006/0182274 | A1 | 8/2006 | Nicolai et al. |
| 2006/0280256 | A1 | 12/2006 | Kwon et al. |
| 2008/0002649 | A1 | 1/2008 | Xia et al. |
| 2008/0123739 | A1* | 5/2008 | Reznic et al. ............ 375/240.08 |
| 2008/0225819 | A1 | 9/2008 | Niu et al. |
| 2008/0256417 | A1* | 10/2008 | Andersson .................... 714/762 |
| 2009/0044071 | A1 | 2/2009 | Hoshino et al. |
| 2009/0092037 | A1* | 4/2009 | Hadad ............................ 370/207 |
| 2009/0204772 | A1* | 8/2009 | Kolze ............................ 711/157 |
| 2009/0323563 | A1* | 12/2009 | Ho et al. ...................... 370/280 |

FOREIGN PATENT DOCUMENTS

| | | |
|---|---|---|
| JP | 2001251199 | 9/2001 |
| KR | 1020060007044 A | 1/2006 |
| KR | 1020060115291 A | 11/2006 |
| WO | WO 02/35853 A2 | 5/2002 |
| WO | 2004049581 A2 | 6/2004 |
| WO | 2006/007571 A1 | 1/2006 |
| WO | WO 2006/007571 A1 | 1/2006 |
| WO | 2006020741 A2 | 2/2006 |

OTHER PUBLICATIONS

"Digital Video Broadcasting (DVB); Framing structure, channel coding and modulation for digital terrestrial television", ETSI EN 300 744, v1.4.1. (Jan. 2001), pp. 1-49.

LG Electronics Inc., WirelessHD Specification Version 1.0 Overview, Oct. 9, 2007, 77 pages.

NEC develops compact millimeter-wave transceiver for uncompressed HDTV signal transmission, NE Asia Online, Apr. 5, 2005, (Downloaded from http://neasia.nikkeibp.com/topstory/000913 on Sep. 29, 2006.).

Korean Notice of Allowance dated Jan. 25, 2010 for Application No. 10-2008-0021026, filed Mar. 6, 2008.

"Digital Video Broadcasting: Framing structure, channel coding and modulation for digital terrestrial television", ETSI EN 300 744, Jan. 2001.

Forney, G., "Burst Correcting Codes for Classic Bursty Channel ,"IEEE Trans. on Communications Technology, vol. 19, No. 5, Oct. 1971.

International Search Report for PCT/KR2007/003172 dated on Nov. 19, 2007.

Babak Hassibi and Bertrand M. Hochwald, "How Much Training is Needed in Multiple-Antenna Wireless Links?", IEEE Transactions on Information Theory, vol. 49, No. 4, Apr. 2003.

Pengfei Xia et al., "Adaptive MIMO-OFDM Based on Partial Channel State Information", IEEE Transactions on signal processing, vol. 52, No. 1, Jan. 2004.

Pengfei Xia et al., "Achieving the Welch Bound With Difference Sets", IEEE Transactions on Information Theory, vol. 51, No. 5, May 2005.

International Search Report for International Application No. PCT/KR2008/001390 dated Jun. 17, 2008 by Korean Intellectual Property Office.

International Search Report for International Application No. PCT/KR2008/001378 dated Jun. 24, 2008 by Korean Intellectual Property Office.

Maruhashi et al. "Wireless Uncompressed-HDTV-Signal Transmission System Utilizing Compact 60-GHz-band Transmitter and Receiver", System Devices Research Laboratories, NEC Corporation, IEEE 2005, pp. 1867-1870.

FreshNews.com, SiBEAM Receives Equity Investment from Best Buy, http://freshnews.com/print/node/261440, Jan. 4, 2010, 2 pages.

Hachman, "CE Giants back Amimon's Wireless HDTV Tech," online: www.pcmag.com, 1 page, Jul. 23, 2008.

International Search Report dated May 21, 2008 for International Application No. PCT/KR2008/000886 from Korean Intellectual Property Office, pp. 1-3, Seo-gu, Daejon, Republic of Korea.

Clark, G.C. et al., "Error Correction Coding for Digital Communications," Plenum Press, 1981, pp. 84-85, United States.

Supplementary European Search Report dated Feb. 23, 2011 for Application No. EP 08723427.4 from European Patent Office, pp. 1-2, Rijswijk, Netherlands.

Examination Report dated Apr. 11, 2011 of the European Application No. 08723427.4 from European Patent Office, pp. 1-6, Rijswijk, Netherlands.

WHDI Special Interest Group, "Full HD Quality and Reliable Connection", Wireless Home Digital Interface (WHDI), downloaded Jun. 7, 2011 from www.whdi.com, 2 p., United States.

International Preliminary Report on Patentability dated Jan. 15, 2009 in PCT/KR07/003129, pp. 1-8, Geneva, Switzerland.

European Telecommunications Standards Institute, "Digital Video Broadcasting: Framing structure, channel coding and modulation for digital terrestrial television", ETSI EN 300 744, Jan. 2001, pp. 1-48, France.

Chinese Office Action dated Dec. 14, 2010 for Chinese Patent Application No. 200880015683.0, pp. 1-3, China Patent Office, People's Republic of China [English-language translation, 4 p.].

U.S. Non-Final Rejection for U.S. Appl. No. 11/724,758 mailed Sep. 21, 2011.

* cited by examiner

SYSTEM AND METHOD FOR PROCESSING WIRELESS HIGH DEFINITION VIDEO DATA USING REMAINDER BYTES

CROSS-REFERENCE TO RELATED APPLICATIONS

This application claims priority under 35 U.S.C. §119(e) from U.S. Provisional Patent Application No. 60/906,382 filed on Mar. 12, 2007, which is hereby incorporated by reference. This application also relates to U.S. patent application Ser. No. 11/863,109 entitled "System and method for processing high definition video data using a shortened last codeword," which is concurrently filed with this application and is incorporated herein by reference.

BACKGROUND OF THE INVENTION

1. Field of the Invention

The present invention relates to wireless transmission of video information, and in particular, to transmission of high definition video information over wireless channels.

2. Description of the Related Technology

With the proliferation of high quality video, an increasing number of electronic devices, such as consumer electronic devices, utilize high definition (HD) video which can require about 1 Gbps (giga bits per second) in bandwidth for transmission. As such, when transmitting such HD video between devices, conventional transmission approaches compress the HD video to a fraction of its size to lower the required transmission bandwidth. The compressed video is then decompressed for consumption. However, with each compression and subsequent decompression of the video data, some data can be lost and the picture quality can be reduced.

The High-Definition Multimedia Interface (HDMI) specification allows transfer of uncompressed HD signals between devices via a cable. While consumer electronics makers are beginning to offer HDMI-compatible equipment, there is not yet a suitable wireless (e.g., radio frequency) technology that is capable of transmitting uncompressed HD video signals. Wireless local area network (WLAN) and similar technologies can suffer interference issues when several devices, which do not have the bandwidth to carry the uncompressed HD signals, are connected together.

SUMMARY OF CERTAIN INVENTIVE ASPECTS

One aspect of the invention provides a method of processing high definition video data to be transmitted over a wireless medium, the method comprising: i) receiving an information packet having the length of L (bytes), wherein $L=(M \times n \times K)+A$, and where: M is the depth of an interleaver, n is the number of interleavers, K is an encoding code length and A is the number of remainder bytes with respect to $M \times n \times K$ bytes, wherein the remainder bytes are located at the end of the information packet, and wherein $M \times n \times K$ bytes represent $M \times n$ codewords and ii) converting the A remainder bytes into a plurality of shortened codewords, wherein each of the shortened codewords is shorter in length than each of the $M \times n$ codewords.

Another aspect of the invention provides a system for processing high definition video data to be transmitted over a wireless medium, the system comprising: i) a first module configured to receive an information packet having the length of L (bytes), wherein $L=(M \times n \times K)+A$, and where: M is the depth of an interleaver, n is the number of interleavers, K is an encoding code length and A is the number of remainder bytes with respect to $M \times n \times K$ bytes, wherein the remainder bytes are located at the end of the information packet, and wherein $M \times n \times K$ bytes represent $M \times n$ codewords and ii) a second module configured to convert the A remainder bytes into a plurality of shortened codewords, wherein each of the shortened codewords is shorter in length than each of the $M \times n$ codewords.

Another aspect of the invention provides a method of processing high definition video data to be transmitted over a wireless medium, the method comprising: i) providing at least one outer interleaver, wherein each of the at least one outer interleaver has a depth of M, and wherein the depth represents the number of columns of each outer interleaver, ii) receiving an information packet having the length of L (bytes), wherein $L=(M \times n \times K)+A$, wherein $n=0, 1, 2, 3, \ldots$ and n represents the number of the at least one outer interleaver, wherein K represents an Reed Solomon (RS) code length, wherein $A=1, 2, 3, \ldots K-1$ and A represents the number of remainder bytes with respect to $M \times n \times K$ bytes, wherein the remainder bytes are located at the end of the information packet, and wherein $M \times n \times K$ bytes represent $M \times n$ codewords, iii) converting the A remainder bytes into four shortened codewords, wherein each of the shortened codewords is shorter in length than each of the $M \times n$ codewords, wherein the four shortened codewords comprise a last codeword, and wherein the last codeword is 8 bytes shorter in length than the remaining three shortened codewords, iv) RS encoding the plurality of shortened codewords based on the RS code length (K); v) adding tail bits to the last codeword so that the length of the last codeword is the same as those of the remaining shortened codewords and vi) outer interleaving the plurality of RS encoded shortened codewords with the tail bits added.

Another aspect of the invention provides a system for processing high definition video data to be transmitted over a wireless medium, the system comprising: i) at least one first outer interleaver, wherein each of the at least one first outer interleaver has a depth of M, and wherein the depth represents the number of columns of each outer interleaver, ii) a first module configured to receive an information packet having the length of L (bytes), wherein $L=(M \times n \times K)+A$, wherein $n=0, 1, 2, 3, \ldots$ and n represents the number of the at least one first outer interleaver, wherein K represents an Reed Solomon (RS) code length, wherein $A=1, 2, 3, \ldots K-1$ and A represents the number of remainder bytes with respect to $M \times n \times K$ bytes, wherein the remainder bytes are located at the end of the information packet, and wherein $M \times n \times K$ bytes represent $M \times n$ codewords, iii) a second module configured to convert the A remainder bytes into four shortened codewords, wherein each of the shortened codewords is shorter in length than each of the $M \times n$ codewords, wherein the four shortened codewords comprise a last codeword, and wherein the last codeword is 8 bytes shorter in length than the remaining three shortened codewords, iv) an RS encoder configured to RS encode the plurality of shortened codewords based on the RS code length (K), v) a third module configured to add tail bits to the last codeword so that the length of the last codeword is the same as those of the remaining shortened codewords and vi) a second outer interleaver configured to outer interleave the plurality of RS encoded shortened codewords with the tail bits added.

Still another aspect of the invention provides a system for processing high definition video data to be transmitted over a wireless medium, the system comprising: i) means for receiving an information packet having the length of L (bytes), wherein $L=(M \times n \times K)+A$, and where: M is the depth of an interleaver, n is the number of interleavers, K is an encoding code length and A is the number of remainder bytes with respect to M×n×K bytes, wherein the remainder bytes are located at the end of the information packet, and wherein M×n×K bytes represent M×n codewords and ii) means for converting the A remainder bytes into a plurality of shortened codewords, wherein each of the shortened codewords is shorter in length than each of the M×n codewords.

DETAILED DESCRIPTION OF CERTAIN INVENTIVE EMBODIMENTS

Certain embodiments provide a method and system for transmission of uncompressed HD video information from a sender to a receiver over wireless channels.

Figure 1:
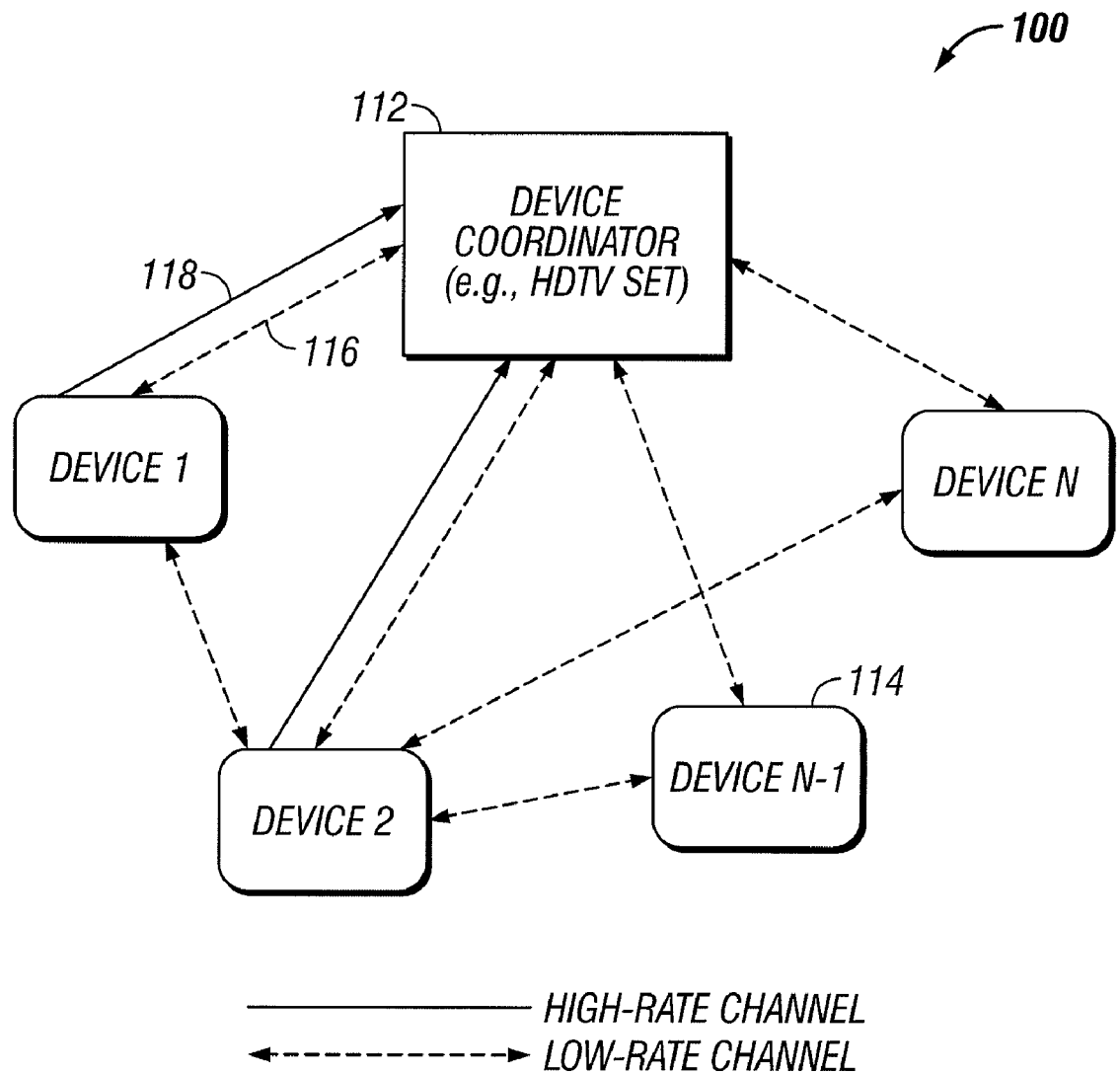
FIG. 1 is a functional block diagram of a wireless network that implements uncompressed HD video transmission between wireless devices according to one embodiment.

Example implementations of the embodiments in a wireless high definition (HD) audio/video (A/V) system will now be described. FIG. 1 shows a functional block diagram of a wireless network 100 that implements uncompressed HD video transmission between A/V devices such as an A/V device coordinator and A/V stations, according to certain embodiments. In other embodiments, one or more of the devices can be a computer, such as a personal computer (PC). The network 100 includes a device coordinator 112 and multiple A/V stations 114 (e.g., Device 1, Device 2, ..., Device N). The A/V stations 114 utilize a low-rate (LR) wireless channel 116 (dashed lines in FIG. 1), and may use a high-rate (HR) channel 118 (heavy solid lines in FIG. 1), for communication between any of the devices. The device coordinator 112 uses a low-rate channel 116 and a high-rate wireless channel 118, for communication with the stations 114.

Each station 114 uses the low-rate channel 116 for communications with other stations 114. The high-rate channel 118 supports single direction unicast transmission over directional beams established by beamforming, with e.g., multi-giga bps bandwidth, to support uncompressed HD video transmission. For example, a set-top box can transmit uncompressed video to a HD television (HDTV) over the high-rate channel 118. The low-rate channel 116 can support bi-directional transmission, e.g., with up to 40 Mbps throughput in certain embodiments. The low-rate channel 116 is mainly used to transmit control frames such as acknowledgement (ACK) frames. For example, the low-rate channel 116 can transmit an acknowledgement from the HDTV to the set-top box. It is also possible that some low-rate data like audio and compressed video can be transmitted on the low-rate channel between two devices directly. Time division duplexing (TDD) is applied to the high-rate and low-rate channel. At any one time, the low-rate and high-rate channels cannot be used in parallel for transmission, in certain embodiments. Beamforming technology can be used in both low-rate and high-rate channels. The low-rate channels can also support omni-directional transmissions.

In one example, the device coordinator 112 is a receiver of video information (hereinafter "receiver 112"), and the station 114 is a sender of the video information (hereinafter "sender 114"). For example, the receiver 112 can be a sink of video and/or audio data implemented, such as, in an HDTV set in a home wireless network environment which is a type of WLAN. In another embodiment, the receiver 112 may be a projector. The sender 114 can be a source of uncompressed video or audio. Examples of the sender 114 include a set-top box, a DVD player or recorder, digital camera, camcorder, other computing device (e.g., laptop, desktop, PDA, etc.) and so forth.

Figure 2:
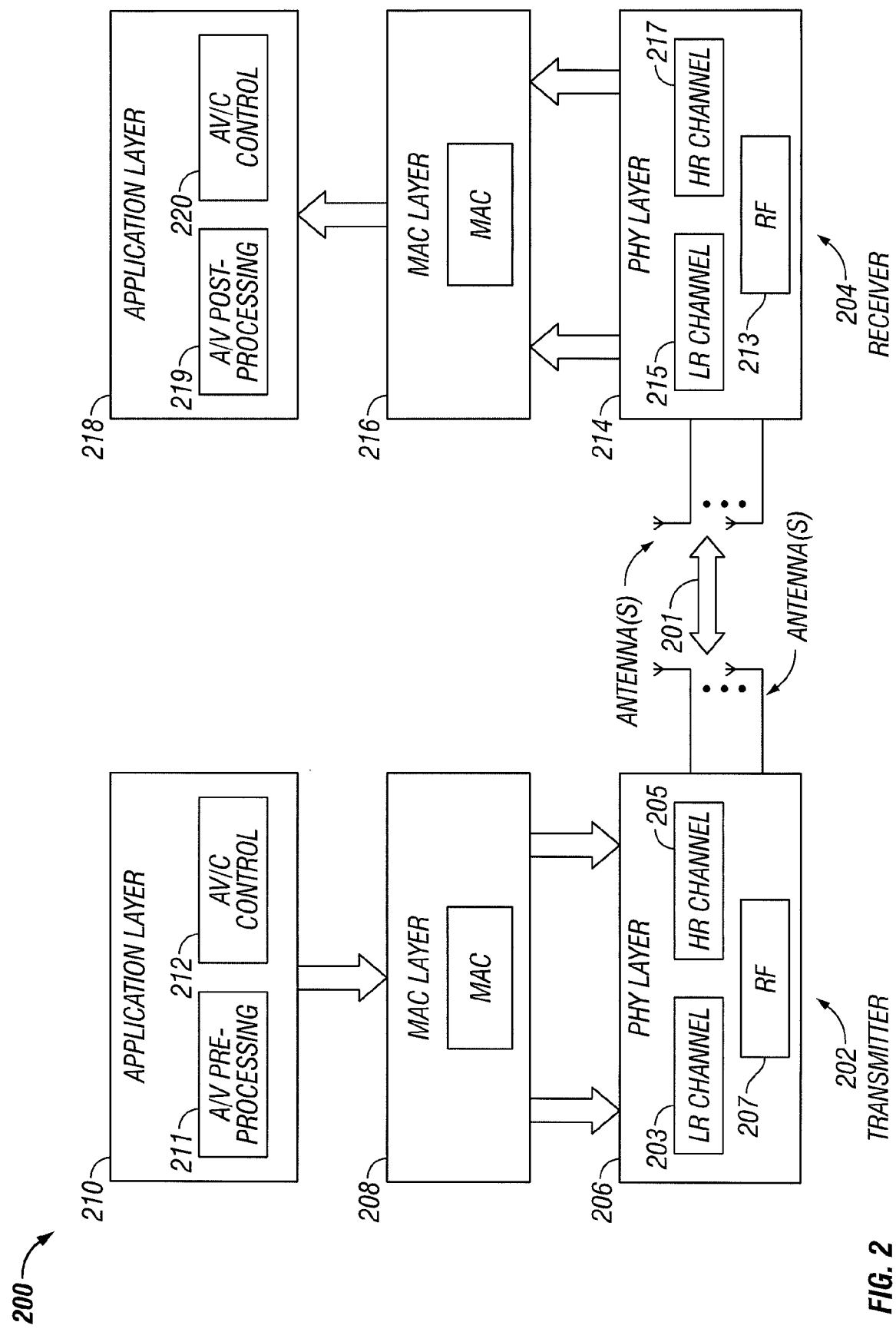
FIG. 2 is a functional block diagram of an example communication system for transmission of uncompressed HD video over a wireless medium, according to one embodiment.

FIG. 2 illustrates a functional block diagram of an example communication system 200. The system 200 includes a wireless transmitter 202 and wireless receiver 204. The transmitter 202 includes a physical (PHY) layer 206, a media access control (MAC) layer 208 and an application layer 210. Similarly, the receiver 204 includes a PHY layer 214, a MAC layer 216, and an application layer 218. The PHY layers provide wireless communication between the transmitter 202 and the receiver 204 via one or more antennas through a wireless medium 201.

The application layer 210 of the transmitter 202 includes an A/V pre-processing module 211 and an audio video control (AV/C) module 212. The A/V pre-processing module 211 can perform pre-processing of the audio/video such as partitioning of uncompressed video. The AV/C module 212 provides a standard way to exchange A/V capability information. Before a connection begins, the AV/C module negotiates the A/V formats to be used, and when the need for the connection is completed, AV/C commands are used to stop the connection.

In the transmitter 202, the PHY layer 206 includes a low-rate (LR) channel 203 and a high rate (HR) channel 205 that are used to communicate with the MAC layer 208 and with a radio frequency (RF) module 207. In certain embodiments, the MAC layer 208 can include a packetization module (not shown). The PHY/MAC layers of the transmitter 202 add PHY and MAC headers to packets and transmit the packets to the receiver 204 over the wireless channel 201.

In the wireless receiver 204, the PHY/MAC layers 214, 216 process the received packets. The PHY layer 214 includes a RF module 213 connected to the one or more antennas. A LR channel 215 and a HR channel 217 are used to communicate with the MAC layer 216 and with the RF module 213. The application layer 218 of the receiver 204 includes an A/V post-processing module 219 and an AV/C module 220. The module 219 can perform an inverse processing method of the module 211 to regenerate the uncompressed video, for example. The AV/C module 220 operates in a complementary way with the AV/C module 212 of the transmitter 202.

In frame based bursty communication systems, information bytes are generally grouped in packets/frames before transmission. Packetization of the information bytes is generally straightforward. However, non-negligible efficiency loss could occur if the packetization is not done properly. This is especially true toward the end of each frame/packet.

In a typical HD video data transmitter for a wireless video area network (WVAN), the packetization task toward the end of the packet is generally non-trivial as the transmitter generally uses Reed Solomon (RS) codes followed by an outer block interleaver code and a parallel of multiple convolutional codes in an orthogonal frequency division multiplexing (OFDM) setup.

In one embodiment, in order to ensure that an integer number of OFDM symbols are created, the high rate physical layer (HRP) will add additional bits to the bit stream, generally called stuff bits, prior to performing any operations on the incoming data. Stuff bits are typically set to zero prior to adding them to the end of the bit stream. The HRP generally adds the minimum number of stuff bits necessary to create an integer number of OFDM symbols for the combination of the physical layer header field, medium access control (MAC) header field and header check sequence (HCS) field. These additional bits are typically discarded by the receiver upon reception. In addition, the HRP generally adds the minimum number of stuff bits necessary to create an integer number of OFDM symbols for each of the subpackets that end on a HRP mode change and for the last subpacket. These additional bits are not included in the calculation of the MAC protocol data unit (MPDU) length field and are discarded by the receiver upon reception.

In the IEEE 802.11n standard, the encoding procedure is defined for a low density parity check (LDPC) coded OFDM system. The design is to meet both the LDPC codeword boundary and the OFDM symbol boundary, while improving the coding performance and padding efficiency. In a wireless HD video data transmitter, more constraints may exist compared with the 802.11n case, because the wireless transmitter may need to meet the RS codeword boundary, the block outer-interleaver boundary, the padding of tail bits for convolutional codes after the outer interleaver, and the OFDM symbol boundary. Therefore, the design is generally more complicated in the WVAN system.

In the digital video broadcast-terrestrial (DVB-T) standard, where a concatenated RS code with convolutional codes is used, the encoding procedure is also much simpler than the wireless HD transmitter because a convolutional outer interleaver is used in the DVB-T system instead of a block interleaver, as well as only one convolutional code is used.

In a typical WVAN system targeting multi-giga bps video/data communications over a short range, information bytes are first equally divided into two branches, with a possibly different modulation and coding method used for each branch, in order to accommodate the unequal error protection concept where the data of the two branches receive a different level of error protection.

Figure 3:
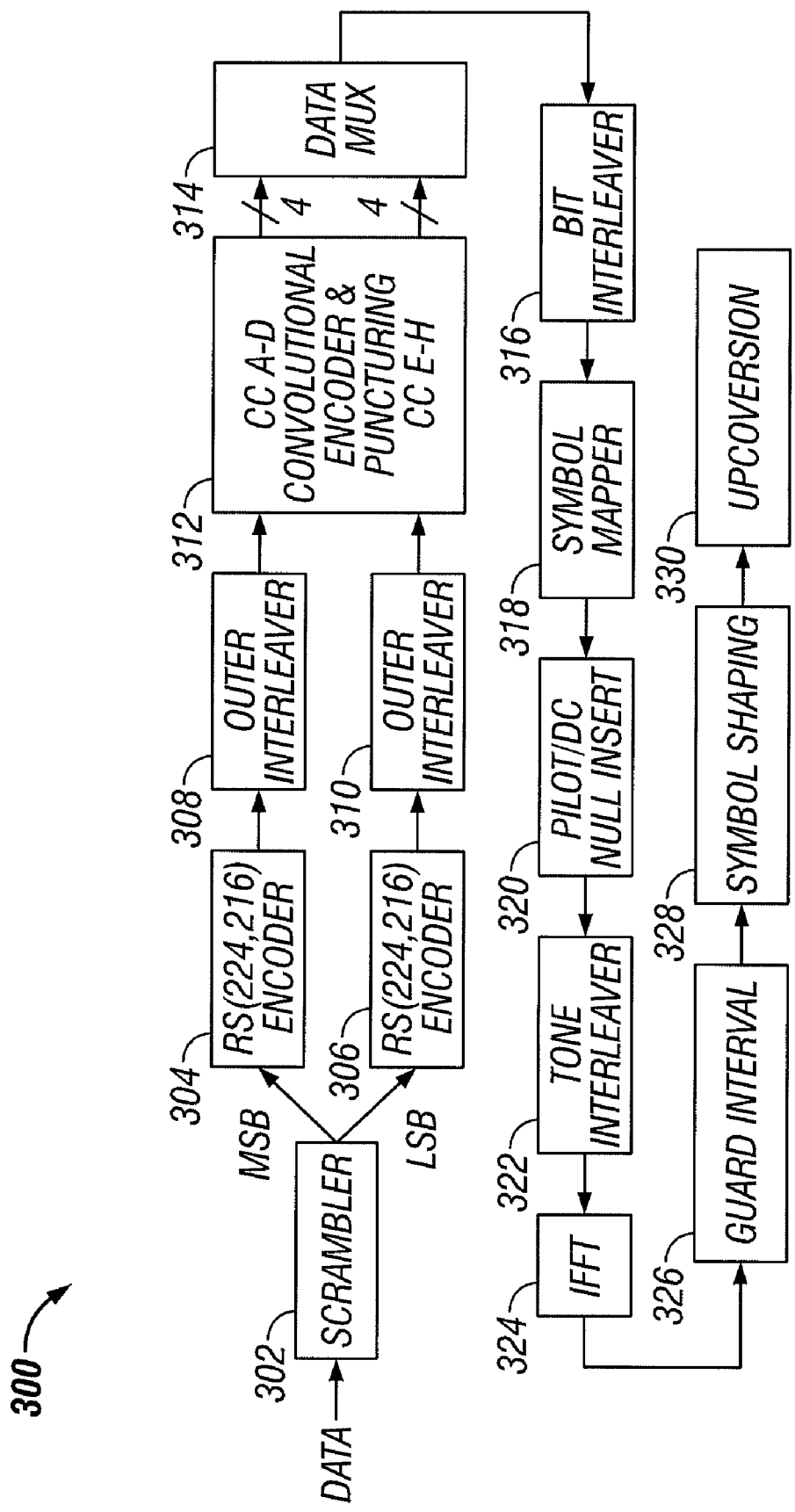
FIG. 3 illustrates an exemplary HD video data transmitter system 300 according to one embodiment of the invention.

FIG. 3 illustrates an exemplary HD video data transmitter system 300 according to one embodiment of the invention. It is appreciated that certain elements of the system 300 may be omitted or combined to other elements of the system 300. In another embodiment, a certain element may be broken into a plurality of sub-elements. Also, the order of certain elements in the system 300 may change. In addition, certain elements, not shown in FIG. 3, may be added to the system 300. Furthermore, specific features of each element shown in FIG. 3 are merely examples and many other modifications may also be possible. In one embodiment, all of the elements of the FIG. 3 system 300 belong to the PHY layer 206 (see FIG. 2). In one embodiment, most significant bits (MSBs) and least significant bits (LSBs) of data are equally protected (EEP) with respect to error codings. In another embodiment, MSBs and LSBs are unequally protected (UEP) with respect to error codings. In one embodiment, all of the elements of the FIG. 3 system 300 can be embodied by either software or hardware or a combination.

In one embodiment, instead of using RS encoders 304 and 306, other outer encoders such as a Bose, Ray-Chaudhuri, Hocquenghem (BCH) encoder can be also used. In one embodiment, instead of using one or more convolutional encoders 312, other inner encoders such as a linear block encoder can be also used. In one embodiment, each of the convolutional encoders 312 may include a plurality of parallel convolutional encoders which encode a plurality of incoming data bits, respectively. In this embodiment, the system 300 may further include at least one parser (not shown), generally located between each of outer interleavers 308, 310 and each of the convolutional encoders 312, which parses the outer interleaved data bits to a corresponding one of the convolutional encoders 312. However, for convenience, the FIG. 3 system will be described based on RS encoders and convolutional encoders.

In another embodiment, it is also possible to have a single RS (or outer) encoder and a single outer interleaver instead of using a pair of those elements 304, 306 and 308, 310. In another embodiment, it is also possible to have more than two of the RS encoders, outer interleavers, convolutional encoders and multiplexers.

Referring to FIG. 3, the system 300 receives an information packet from a MAC layer (see 208 in FIG. 2). In one embodiment, a scrambler 302 scrambles the received packet and outputs most significant bits (MSBs) and least significant bits (LSBs) to the first and second RS encoders 304, 306, respectively.

The RS encoders 304, 306 encode the MSBs and LSBs, respectively. The first and second outer interleavers 308, 310 outer interleave the RS encoded data, respectively. In one embodiment, each of the outer interleavers 308, 310 is a block interleaver or a convolutional interleaver. In another embodiment, other forms of interleavers are also possible.

The convolutional encoder(s) 312 perform(s) convolutional encoding and puncturing on the outer interleaved data, and output(s), for example, four bits of data, corresponding to the MSBs and LSBs, respectively, to a multiplexer 314. In one embodiment, the convolutional encoders 312 may include a plurality of convolutional (or inner) encoders some of which are for the MSBs and the others of which are for the LSBs. In this embodiment, the number of convolutional encoders for MSB data may be the same (e.g., 4 and 4) as that of inner encoders for LSB data. In another embodiment, the number of convolutional encoders for MSB data may be different (e.g., 6 and 2) from that of convolutional encoders for LSB data. In one embodiment, each of the convolutional encoders may provide equal error protection (EEP) for all incoming data bits. In another embodiment, the convolutional encoders may provide unequal error protection (UEP) for all incoming data bits.

The multiplexer 314 multiplexes the bit streams output from the convolutional encoders 312 to a multiplexed data stream to be provided to a bit interleaver 316. The bit interleaver 316 bit-interleaves the multiplexed data stream. A symbol mapper 318 performs symbol mapping such as quadrature amplitude modulation (QAM) mapping on the bit-interleaved data. A pilot/DC null insert unit 320 and a tone interleaver 322 perform pilot/DC null inserting and tone interleaving, respectively. An inverse Fourier fast transform (IFFT) unit 324 performs IFFT processing on the output of the tone interleaver 322. A guard interval unit 326 and a symbol shaping unit 328 perform guard interval and symbol shaping for the IFFT processed data, sequentially. In one embodiment, the IFFT unit 324 and the guard interval unit 326 together perform orthogonal frequency division multiplexing (OFDM) modulation. An upconversion unit 330 performs upconversion on the output of the symbol shaping unit 328 before transmitting the data packet to a HD video data receiver over the wireless channel 201 (see FIG. 2). In one embodiment, the HD video data receiver may include a single convolutional decoder or a plurality of convolutional decoders corresponding to the convolutional encoder(s) of the transmitter system 300.

In one embodiment, as shown in FIG. 3, each branch is first encoded by an RS code (224, 216, t=4), followed by a block interleaver 308, 310 of size, for example, 4×224 (depth four outer interleaver). For each branch, the interleaved output is parsed into, for example, M=4 parallel convolutional encoders 312. For each convolutional code, a certain length of all-zero tail bits are inserted into the output of the outer interleaver 308, 310 by further shortening of the RS code. Insertion of the tail bits is to simplify the decoding task of convolutional codes at the receiver side.

Further describing inserting tail bits based on one embodiment, the information symbols are divided into equal-sized units, with each unit containing equal 4×K information symbols, so that each unit after RS encoding matches with the interleaver size. In this embodiment, the ending unit (or the last unit) would have $0 \geqq q \leqq 4 \times K$ symbols available, while q may take arbitrary value in between.

In one embodiment, the ending packet contains 4×(K−M) information symbols, with each symbol being, for example, 8-bit long. Additional zeros may be added to the data packets (with the tail-bit-zeros for convolutional codes to be added later), which will lower the overall efficiency. Since each unit is of 4K symbols (or 32K bits), each subpacket (approximately 50 μs long) may contain up to only 10 units for 1080i (1080 interlaced scan). Thus, in order to meet the boundaries of the RS encoder and block interleaver, such a packetization leads to an average efficiency reduction of about 5% and a maximum efficiency reduction of about 10% for 1080i.

One embodiment of the invention provides a systematic way to do packetization of the information bits for wireless HD video communication systems and provides much higher padding efficiency (i.e., much more efficient padding) while improving the decoding performance.

Summarizing the operation of the FIG. 3 system, data is first RS encoded and then outer interleaved using, for example, a depth four block interleaver. The interleaved data is parsed into, for example, 8 parallel convolutional encoders where each convolutional encoder requires tail bits to terminate. The convolutional encoded data bits are multiplexed together, interleaved and mapped to QAM constellation for OFDM modulation. In one embodiment, the transmitted data bits meet the following: (1) integer number of RS codeword, (2) integer number of outer interleaver size, (3) tail bits need to be inserted before CC encoding and (4) additional padding bits are needed to ensure integer number of OFDM symbols.

For convenience, four encoding schemes shown in FIGS. 4-11, which meet the above four requirements, will be described. Typically, as additional padding bits are inserted and transmitted, the more padding bits are added, the lower the transmission efficiency. Therefore, at least one embodiment maximizes the efficiency while maintaining the coding performance and the simplicity of the system. It is appreciated that the four schemes are merely exemplary and other schemes may also be possible. In one embodiment, the four schemes can be implemented with the FIG. 3 system.

Scheme 1

Figure 4:
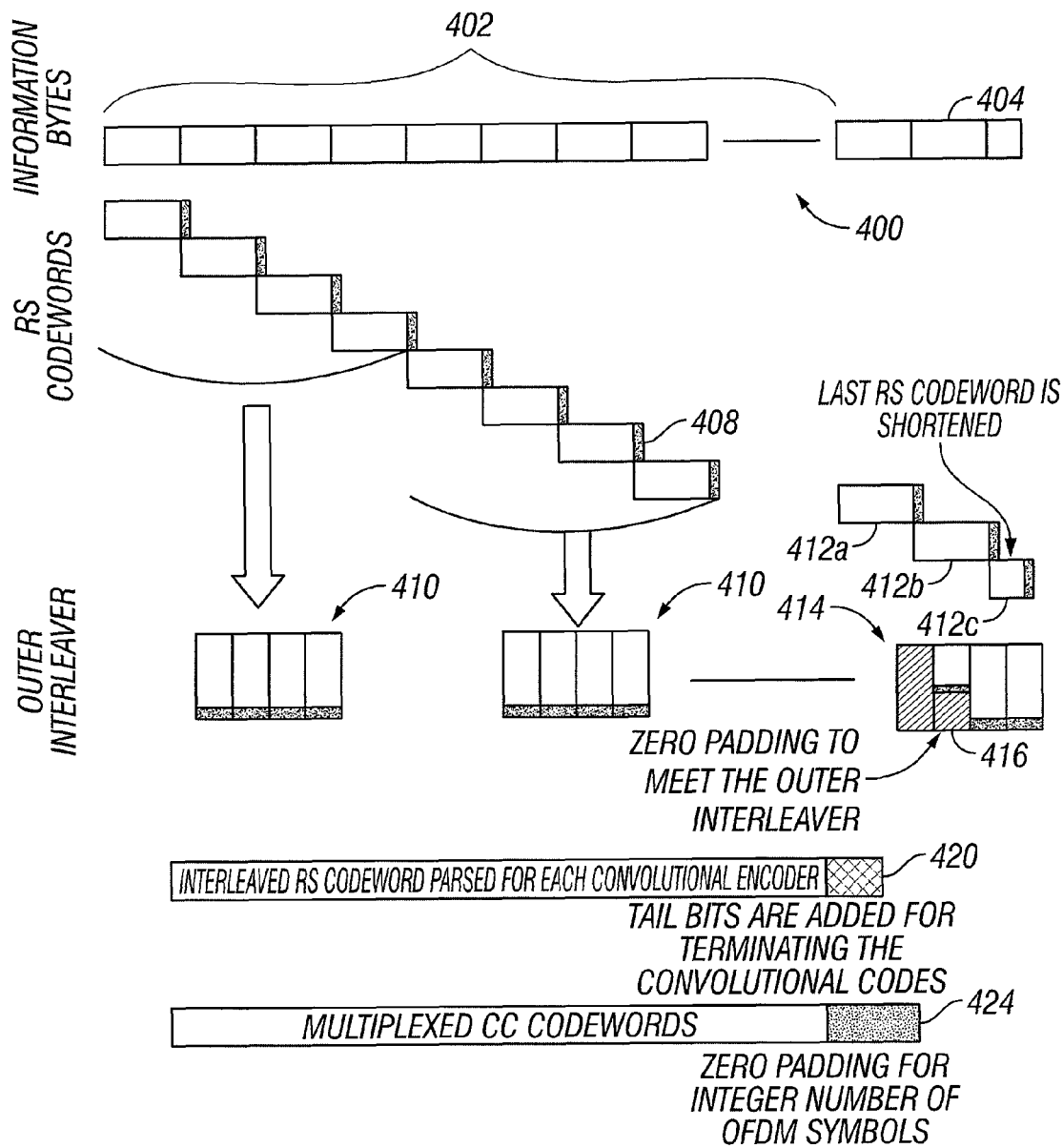
FIG. 4 illustrates a conceptual diagram showing an encoding procedure of a HD video data transmitter for a wireless video area network (WVAN) according to one embodiment of the invention.
Figure 5:
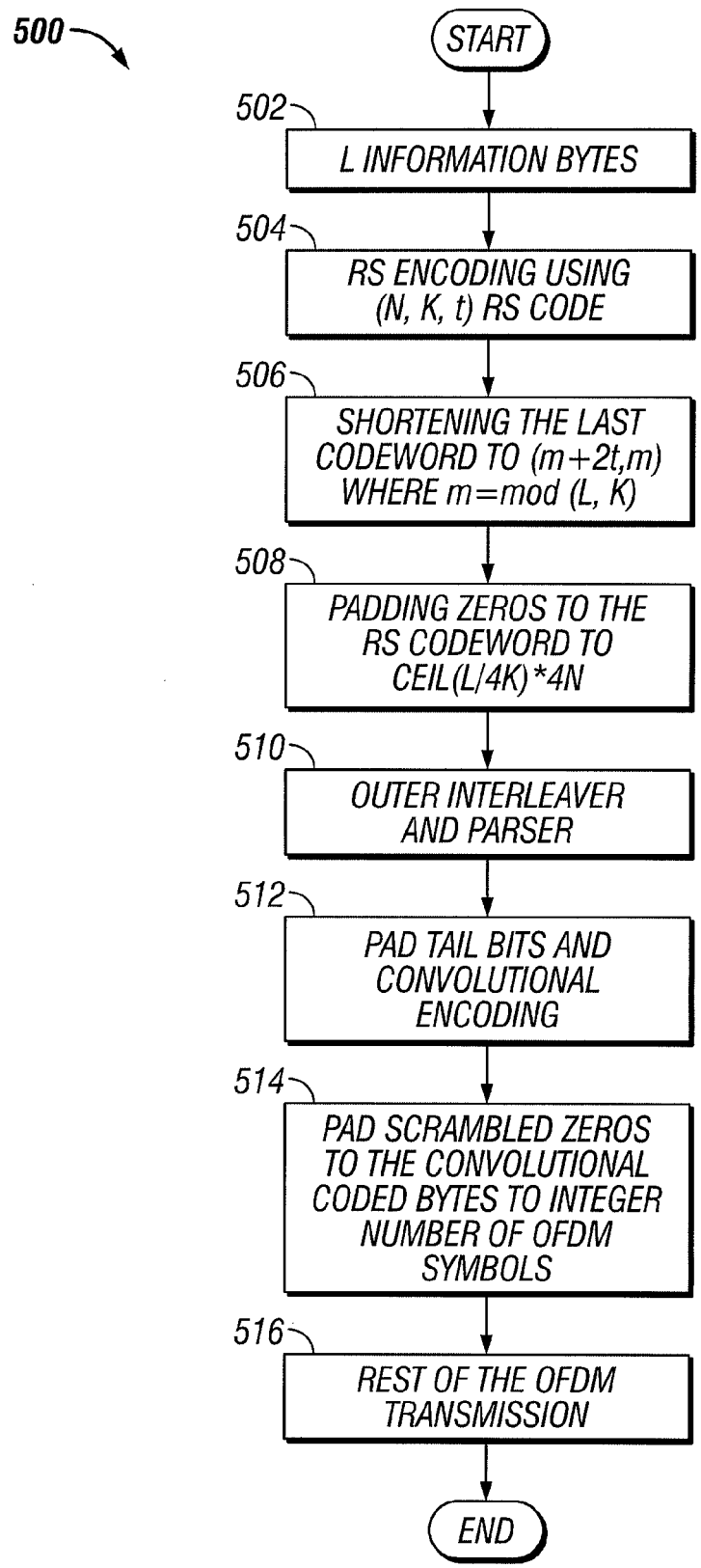
FIG. 5 is an exemplary flowchart for the encoding procedure according to one embodiment of the invention.

FIG. 4 illustrates a conceptual diagram showing an encoding procedure 500 (see FIG. 5) of a HD video data transmitter for a wireless video area network (WVAN) according to one embodiment of the invention. FIG. 5 is an exemplary flowchart for the encoding procedure 500 according to one embodiment of the invention.

In one embodiment, the encoding procedure 500 is implemented in a conventional programming language, such as C or C++ or another suitable programming language. In one embodiment of the invention, the program is stored on a computer accessible storage medium at a HD video data transmitter for a WVAN, for example, a device coordinator 112 or devices (1–N) 114 as shown in FIG. 1. In another embodiment, the program can be stored in other system locations so long as it can perform the transmitting procedure 500 according to embodiments of the invention. The storage medium may comprise any of a variety of technologies for storing information. In one embodiment, the storage medium comprises a random access memory (RAM), hard disks, floppy disks, digital video devices, compact discs, video discs, and/or other optical storage mediums, etc. In another embodiment, at least one of the device coordinator 112 and devices (1–N) 114 comprises a processor (not shown) configured to or programmed to perform the transmitting procedure 900. The program may be stored in the processor or a memory of the coordinator 112 and/or the devices (1–N) 114. In various embodiments, the processor may have a configuration based on, for example, i) an advanced RISC machine (ARM) microcontroller, ii) Intel Corporation's microprocessors (e.g., the Pentium family microprocessors) and iii) Microsoft Corporation's Windows operating systems (e.g., Windows 95, Windows 98, Windows 2000 or Windows NT). In one embodiment, the processor is implemented with a variety of computer platforms using a single chip or multichip microprocessors, digital signal processors, embedded microprocessors, microcontrollers, etc. In another embodiment, the processor is implemented with a wide range of operating systems such as Unix, Linux, Microsoft DOS, Microsoft Windows 2000/9x/ME/XP, Macintosh OS, OS/2 and the like. In another embodiment, the transmitting procedure 500 can be implemented with an embedded software. Depending on the embodiments, additional states may be added, others removed, or the order of the states changes in FIG. 5. The description of this paragraph applies to the remaining schemes shown in FIGS. 6-11.

Referring to FIGS. 3-5, the operation of the scheme 1 encoding procedure will be described in greater detail. For convenience, it is assumed that an outer encoder is an RS encoder and an inner encoder is a convolutional encoder. It is appreciated that other outer encoders or other inner encoders (for example as discussed above) may also be used. The same applies to the remaining schemes 2-4 illustrated in FIGS. 6-11.

In one embodiment, scheme 1 provides the most straightforward encoding procedure among the four schemes. In one embodiment, the system 300 receives L information bytes 400 from the MAC layer (502). The information bytes 400 include main codewords 402 and remainder codewords 404. The remainder codewords 404 are less than, e.g., four codewords and located at the end of the information packet 400. Each block of the information bytes 400 represents a codeword having the length of, e.g., 1K bytes, where K=1024. This applies to the remaining schemes shown in FIGS. 6-11.

The system 300 RS encodes the information bytes 402 with the RS code of (N, K, t), where K is the number of information bytes, N is the number of bytes in the codeword, and t is correction capability (504). After the RS encoding, 2t (e.g., 8) bytes of parity bits 408 are added per codeword to form the size N byte codewords as shown in FIG. 4. The last codeword 412c of the three remainder codewords 412a-412c is shortened to, for example, (m+2t, m), wherein m=mod(L, K) (506). This is to reduce the transmission time, which will further improve the performance of the last codeword 412c. In one embodiment, the shortening of the last codeword 412c may be performed by at least one of the RS encoders 304, 306. In another embodiment, the shortening of the last codeword 412c may be performed by another element of the FIG. 3 system or a separate element which is not shown in FIG. 3. This applies to the remaining schemes shown in FIGS. 6-11.

In one embodiment, certain length of zeros 416 are padded to the RS encoded codewords to, for example, ceil (L/4K)× 4N (508). In one embodiment, each of the outer interleavers has a depth of 4 (the number of columns of each outer interleaver) as shown in FIG. 4. The outer interleaver may have the size of 4×224 bytes. The zero padding is to form a set of four codewords 414 in order to meet the depth four outer interleaver requirement. In one embodiment, the zero padding may be performed by at least one of the outer interleavers 308, 310. In another embodiment, the zero padding may be performed by another element of the FIG. 3 system or a separate element which is not shown in FIG. 3. This applies to the remaining schemes shown in FIGS. 6-11.

The RS encoded codewords 410 and zero-padded codewords 414 are outer interleaved and parsed (510). In this embodiment, each outer interleaver performs outer interleaving on a set of four codewords 410 and 414. This applies to the remaining schemes shown in FIGS. 6-11.

Tail bits 420 are further inserted to the outer interleaved data and convolutional encoding is performed for the data having the tail bits 420 thereafter (512). Padding tail bits 420 is to terminate the convolutional codes such that decoding at the receive side is properly performed. In one embodiment, 1 byte of tail bits (e.g., 1 byte of zeros) is added per a convolutional encoder. For example, for 8 convolutional encoders, 8 bytes of tail bits are added. In one embodiment, padding tail bits 420 in state 512 may be performed by at least one of the outer interleavers 308, 310. In another embodiment, the padding of the tail bits may be performed by another element of the FIG. 3 system or a separate element which is not shown in FIG. 3. This applies to the remaining schemes shown in FIGS. 6-11.

More scrambled zeros 424 are inserted to the convolutional coded bytes in order to provide an integer number of OFDM symbols (514). Multiplexing of the data having the scrambled zeros 424 is performed thereafter. In one embodiment, padding scrambled zeros 424 may be performed by the multiplexer 314. In another embodiment, padding scrambled zeros 424 may be performed by another element of the FIG. 3 system or a separate element which is not shown in FIG. 3. This applies to the remaining schemes shown in FIGS. 6-11. Thereafter, the rest of the OFDM transmission procedure is performed by the remaining elements 316-330 of the FIG. 3 system (516). This applies to the remaining schemes shown in FIGS. 6-11.

Scheme 2

Figure 6:
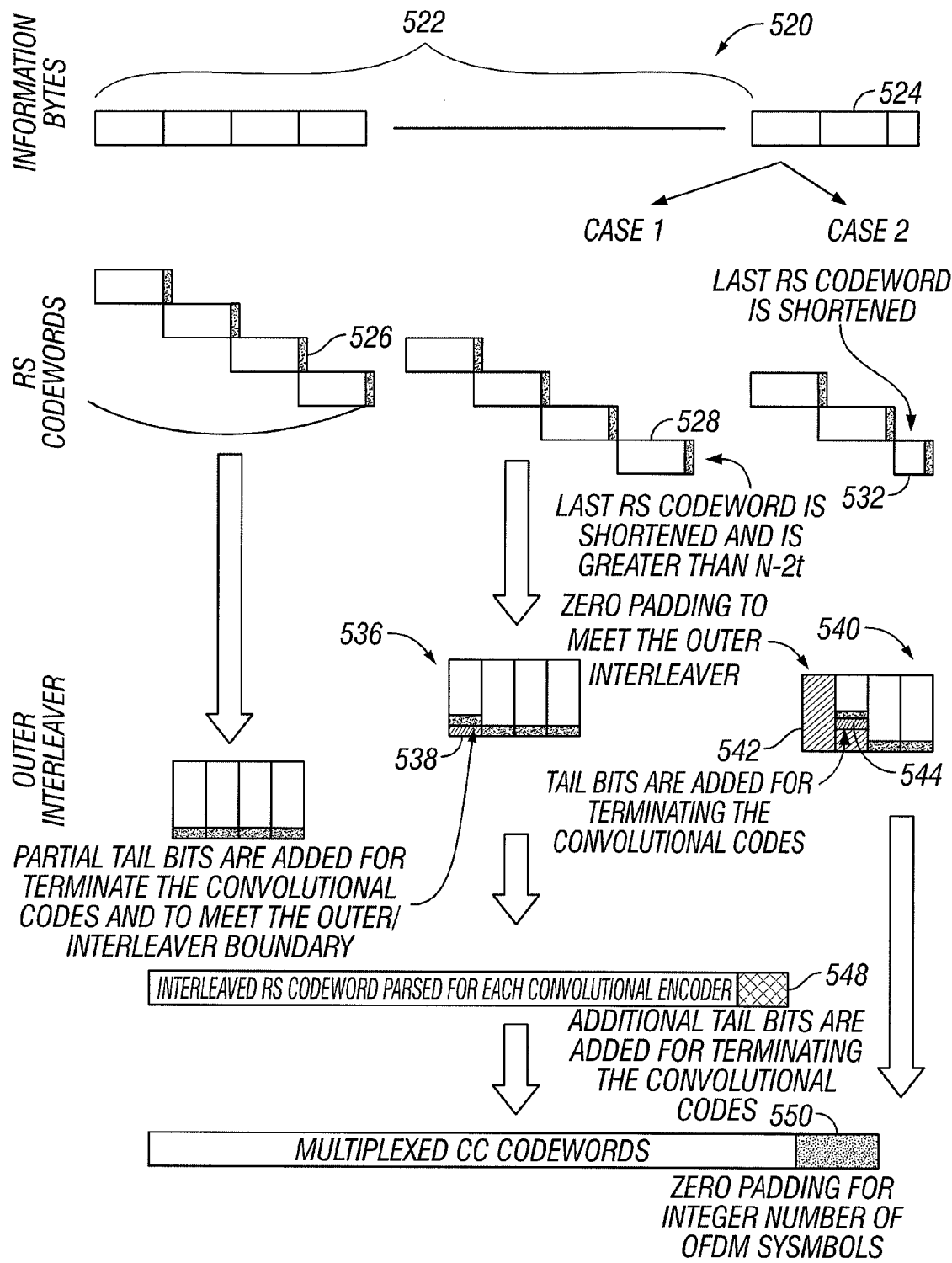
FIG. 6 illustrates a conceptual diagram showing an encoding procedure of a HD video data transmitter for a WVAN according to another embodiment of the invention.
Figure 7:
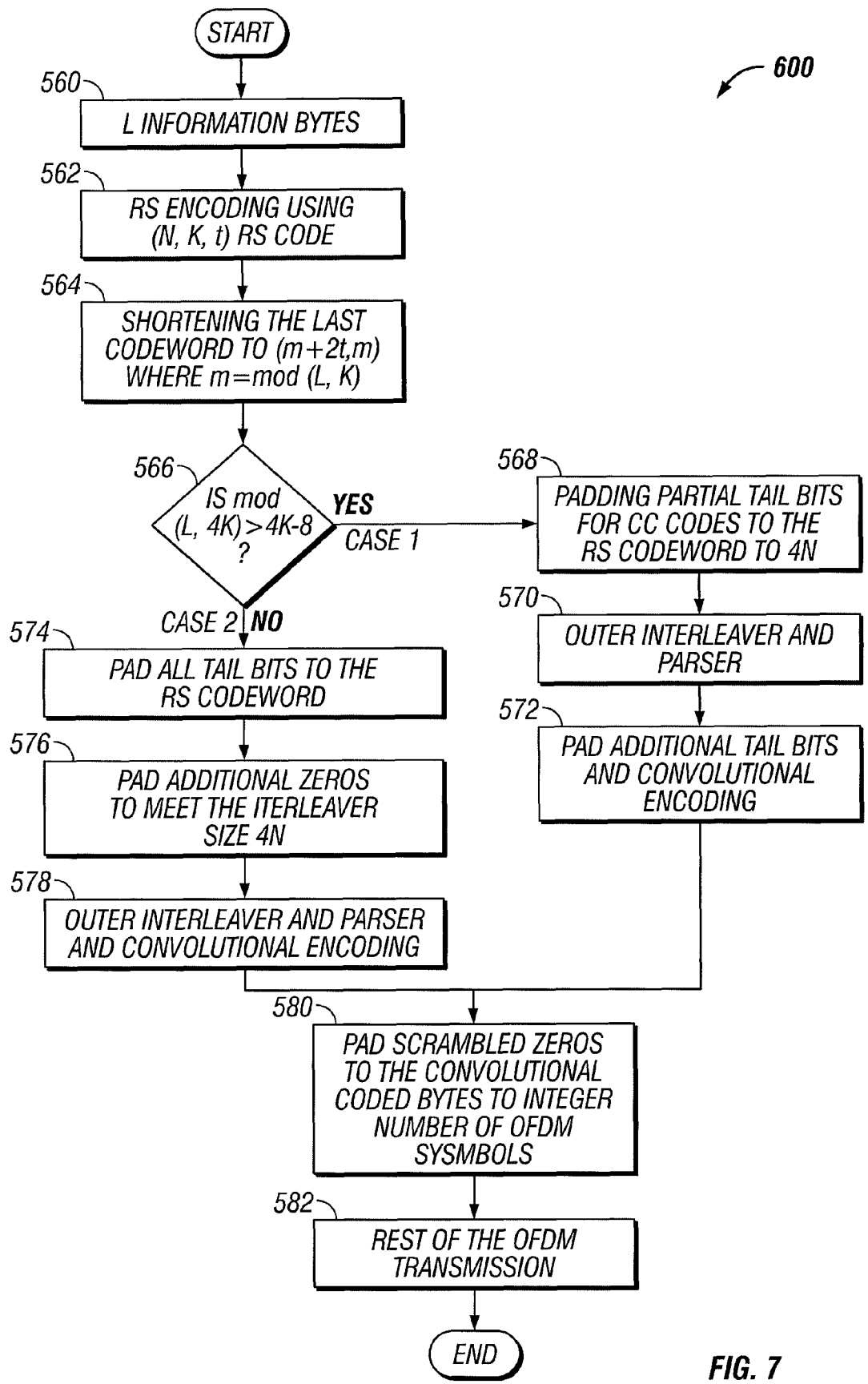
FIG. 7 is an exemplary flowchart for the encoding procedure according to one embodiment of the invention.

FIG. 6 illustrates a conceptual diagram showing an encoding procedure 600 (see FIG. 7) of a HD video data transmitter for a WVAN according to another embodiment of the invention. FIG. 7 is an exemplary flowchart for the encoding procedure 600 according to one embodiment of the invention. Referring to FIGS. 3 and 6-7, the operation of the scheme 2 encoding procedure will be described in greater detail.

Scheme 1 provides relatively a straightforward scheme. However, the padding efficiency may be low. Scheme 2 provides some improvement on transmission efficiency over scheme 1. The system 300 receives L information bytes 520 from the MAC layer (560). The information bytes 520 may include main codewords 522 and remainder codewords 524.

The system 300 RS encodes the information bytes 520 with the RS code of (N, K, t), where K is the number of information bytes, N is the number of bytes in the codeword, and t is correction capability (562). After the RS encoding, 2t parity bytes 526 are added to form the size N byte codewords as shown in FIG. 6.

The last codeword 528 (case 1) or 532 (case 2) of the RS encoded remainder codewords is shortened to, for example, (m+2t, m), wherein m=mod(L, K) (564). It is determined whether mod(L, 4K) for the last codeword 532 is greater than 4K−8 (566). If it is greater than 4K−8 (case 1), partial tail bits 538, for example, less than 8 bytes, are inserted into the RS encoded codewords to form a set of four codewords 536 which meets the depth four outer interleaver requirement (568). The RS encoded codewords 536 with the partial tail bits 538 added are outer interleaved and parsed (570). Additional tail bits 548, for example, 8 bytes minus the number of the partial tail bits, are added to the outer interleaved data such that total tail bits added are 8 bytes (572). Convolutional encoding is performed for the outer interleaved data having the tail bits (partial tail bits 538+additional tail bits 548) thereafter (572).

If it is determined in state 566 whether mod(L, 4K) for the last codeword 532 is not greater than 4K−8 (case 2), entire tail bits 544 (e.g., 8 bytes) are added to the RS encoded codewords (574). Thereafter, certain length of zeros 542 are padded to the RS encoded codewords to form a set of four codewords 540 which meets the depth four outer interleaver requirement (576). In one embodiment, padding tail bits 538 and 544, and padding zeros 542 may be performed by at least one of the outer interleavers 308, 310. In another embodiment, the padding of the tail bits 538, 544 and zeros 542 may be performed by another element of the FIG. 3 system or a separate element which is not shown in FIG. 3. The RS encoded codewords 540, with the tail bits 544 and zeros 542 added, are outer interleaved, parsed and convolutional encoded (578). In case 2, since the entire tail bits 544 have been added in state 574, additional tail bits may not need to be added unlike case 1 (see states 568 and 572).

Scrambled zeros 550 are inserted to the convolutional coded bytes in order to provide an integer number of OFDM symbols (580). Multiplexing of the data having the scrambled zeros 550 is performed thereafter. In state 582, the rest of the OFDM transmission procedure is performed.

Scheme 3

Figure 8:
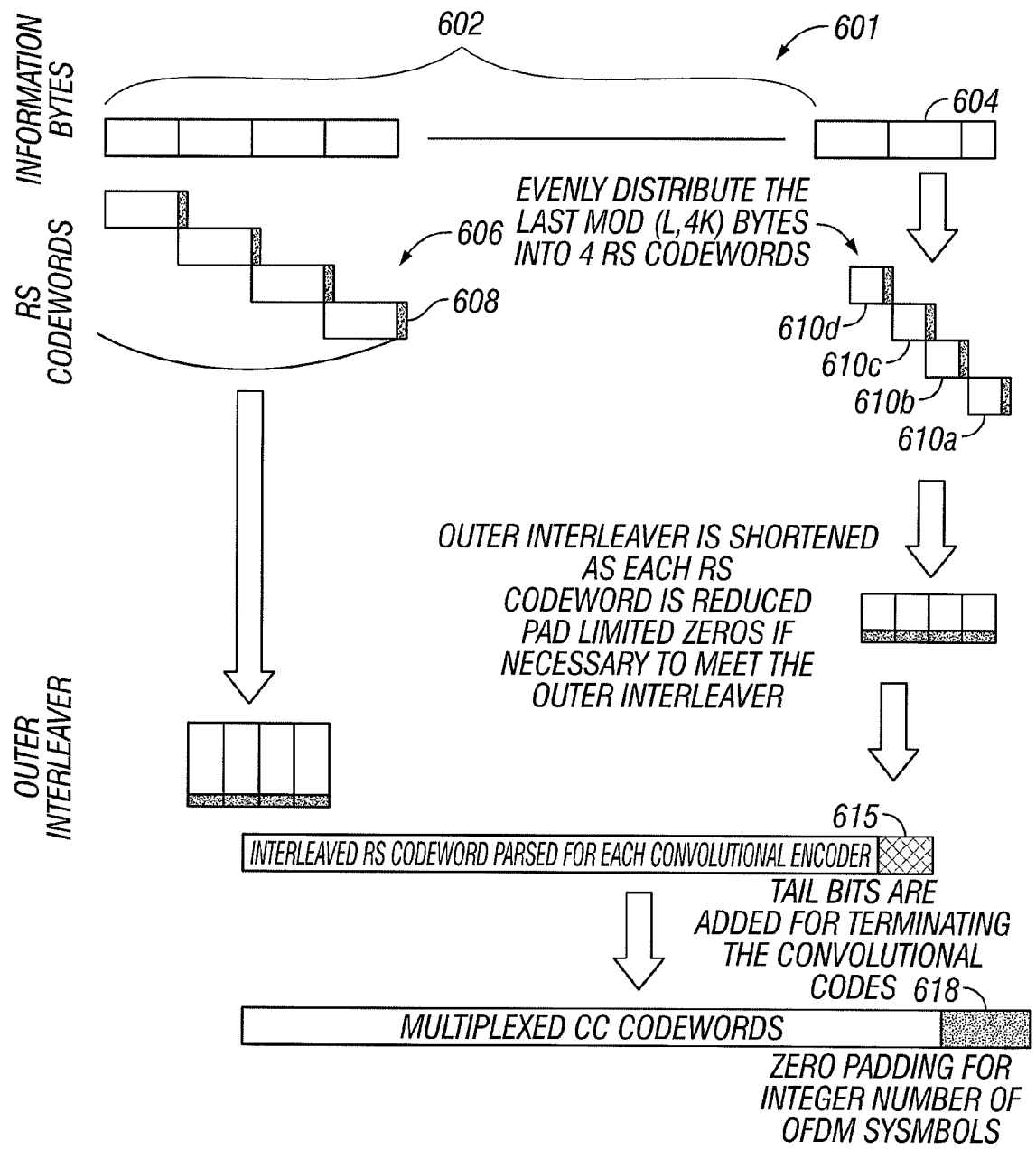
FIG. 8 illustrates a conceptual diagram showing an encoding procedure of a HD video data transmitter for a WVAN according to another embodiment of the invention.
Figure 9:
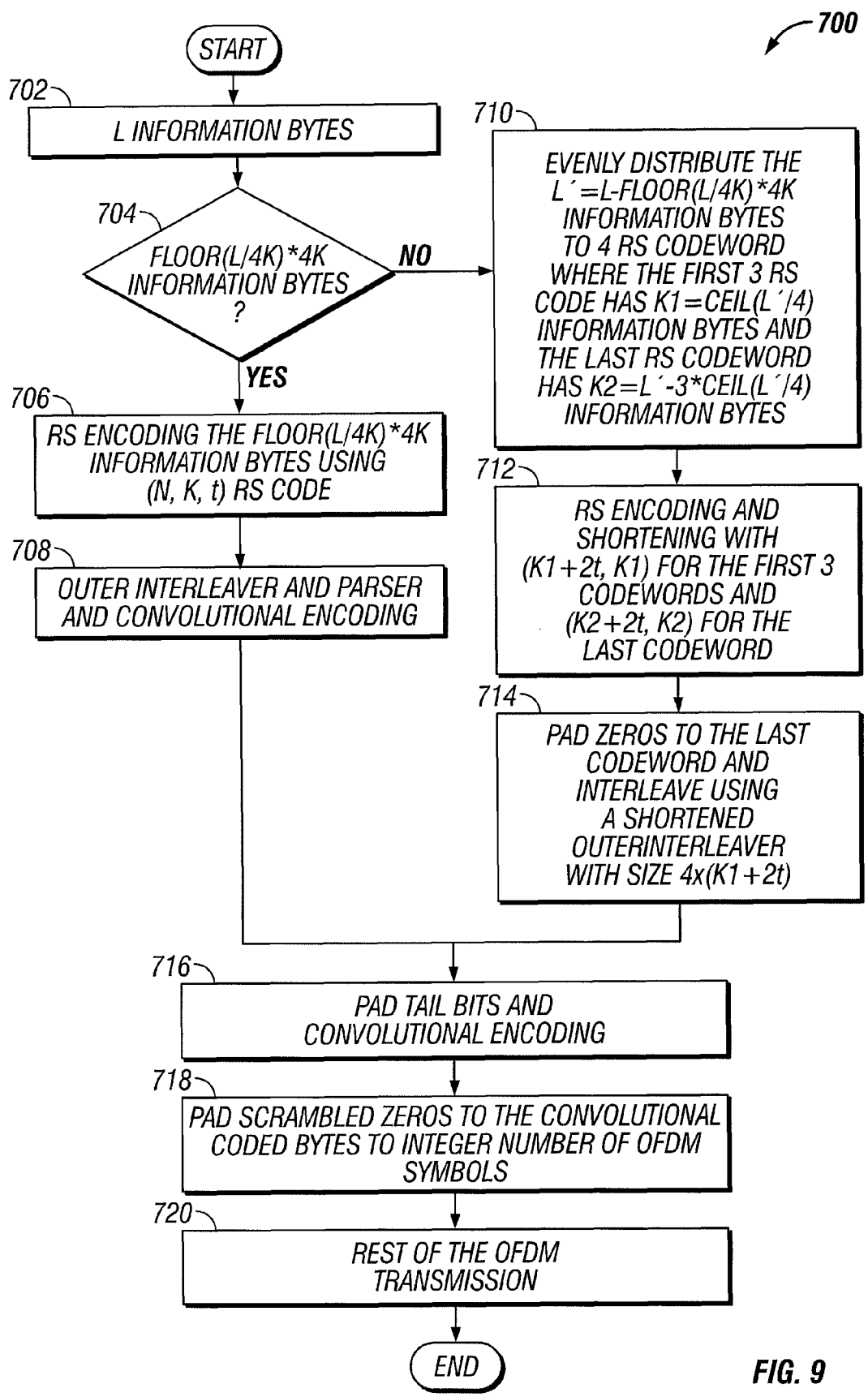
FIG. 9 is an exemplary flowchart for the encoding procedure according to one embodiment of the invention.

FIG. 8 illustrates a conceptual diagram showing an encoding procedure 700 (see FIG. 9) of a HD video data transmitter for a WVAN according to another embodiment of the invention. FIG. 9 is an exemplary flowchart for the encoding procedure 700 according to one embodiment of the invention.

Referring to FIGS. 3 and 8-9, the operation of the scheme 3 encoding procedure will be described in greater detail.

The schemes 1 and 2 keep the size of the outer interleaver and pad zeros in different ways. However, due to the relatively large size of the outer interleaver (e.g., 4×224 bytes), the efficiency may be limited. Scheme 3 may further improve the efficiency and the RS code performance over the schemes 1 and 2. In one embodiment, in scheme 3, instead of shortening only the last codeword, all of the last four codewords are shortened, which can evenly improve the RS performance, at the same time enable the usage of a shortened outer interleaver.

Referring to FIGS. 3 and 8-9, the operation of scheme 3 encoding procedure will be described in greater detail. The system 300 receives L information bytes 601 from the MAC layer (702). The information bytes 601 may include main codewords 602 and remainder codewords 604. The system 300 calculates the value of "floor(L/4K)×4K", where K represents an RS code length (704). For convenience, it is assumed that L=4nK+A (bytes), wherein n=0, 1, 2, 3, . . . and n represents the number of outer interleavers, wherein A=1, 2, 3, . . . K−1 and A represents the number of remainder bytes with respect to 4nK bytes. 4nK bytes represent 4n codewords. Each outer interleaver performs outer interleaving on a set of four codewords 606. Each codeword includes 2t parity bytes (e.g., 8 bytes) 608.

State 704 separates encoding processing for the first 4nK bytes from encoding processing for the remainder bytes (A). The first 4nK information bytes are RS encoded with, for example, an RS code (N, K, t), wherein t is error correction capability (bytes) and N=K+2t (706). The RS encoded data is outer interleaved, parsed and convolutional encoded (708).

With regard to the remainder bytes (A), the system 300 evenly distributes the remainder bytes (A=L'=L−floor (L/4K)×4K) to four RS codewords 610a-610d, where the first three RS codes 610a-610c have K1 information bytes and the last RS codeword 610d has K2 information bytes (710). In one embodiment, K1 is obtained using the equation "ceil (L'/4)" and K2 is obtained using the equation "L'−3×ceil (L'/4)." The four codewords (610a-610d) are RS encoded and shortened with an RS code (K1+2t, K1, t) for the first three codewords (610a-610c) and an RS code (K2+2t, K2, t) for the last codeword 610d (712). In one embodiment, states 704, 710 and 712 may be performed by at least one of the RS encoders 304, 306. In another embodiment, states 704, 710 and 712 may be performed by another element of the FIG. 3 system or a separate element which is not shown in FIG. 3.

If needed to meet the outer encoder size requirement, a certain length of zeros (e.g., 1-3 bytes) may be padded to the last codeword 610d (714). The RS encoded data is outer interleaved using a shortened outer interleaver with the size of 4×(K1+2t) (714).

In one embodiment, the system 300 adds tail bits 615 (e.g., 4×8 bytes for the four codewords) to the data which has been outer interleaved in states 708 and 714 in order to terminate convolutional codes, and performs convolutional encoding on the outer interleaved data as shown in FIG. 8 (716). In one embodiment, the adding of the tail bits 615 may be performed by an element other than the outer interleavers 308, 310. In another embodiment, the adding of the tail bits 615 may be performed by the outer interleavers 308, 310 after the outer interleaving is complete.

In one embodiment, additional zeros 618 may be added to the convolutional encoded data to satisfy the integer number requirement of OFDM symbols before multiplexing (718). Thereafter, the rest of the OFDM transmission procedures is performed (720).

In one embodiment, as the RS encoders are shortened in size with respect to the remainder codewords, so is the outer interleaver for the remainder codewords. For example, if the number of the remainder bytes 604 is 32 bytes, K1=K2=8 using the above equations, thus each codeword would have 8 bytes and 8 parity bytes. This can be implemented with an outer interleaver having the size of 4×(K1+2t)=4×(8+8)=4×16 bytes, which provides a significantly higher efficiency compared to the outer interleaver having the size of 4×224 bytes.

As another example, if the number of the remainder bytes 604 is 23 bytes, K1=6 and K2=5 using the above equations. In this example, one byte of zeros is added to the last codeword and each codeword would have 6 bytes and 8 parity bytes. This can be implemented with an outer interleaver having the size of 4×(K1+2t))=4×(6+8)=4×14 bytes, which provides a significantly higher efficiency compared to the outer interleaver having the size of 4×224 bytes.

Scheme 4

Figure 10:
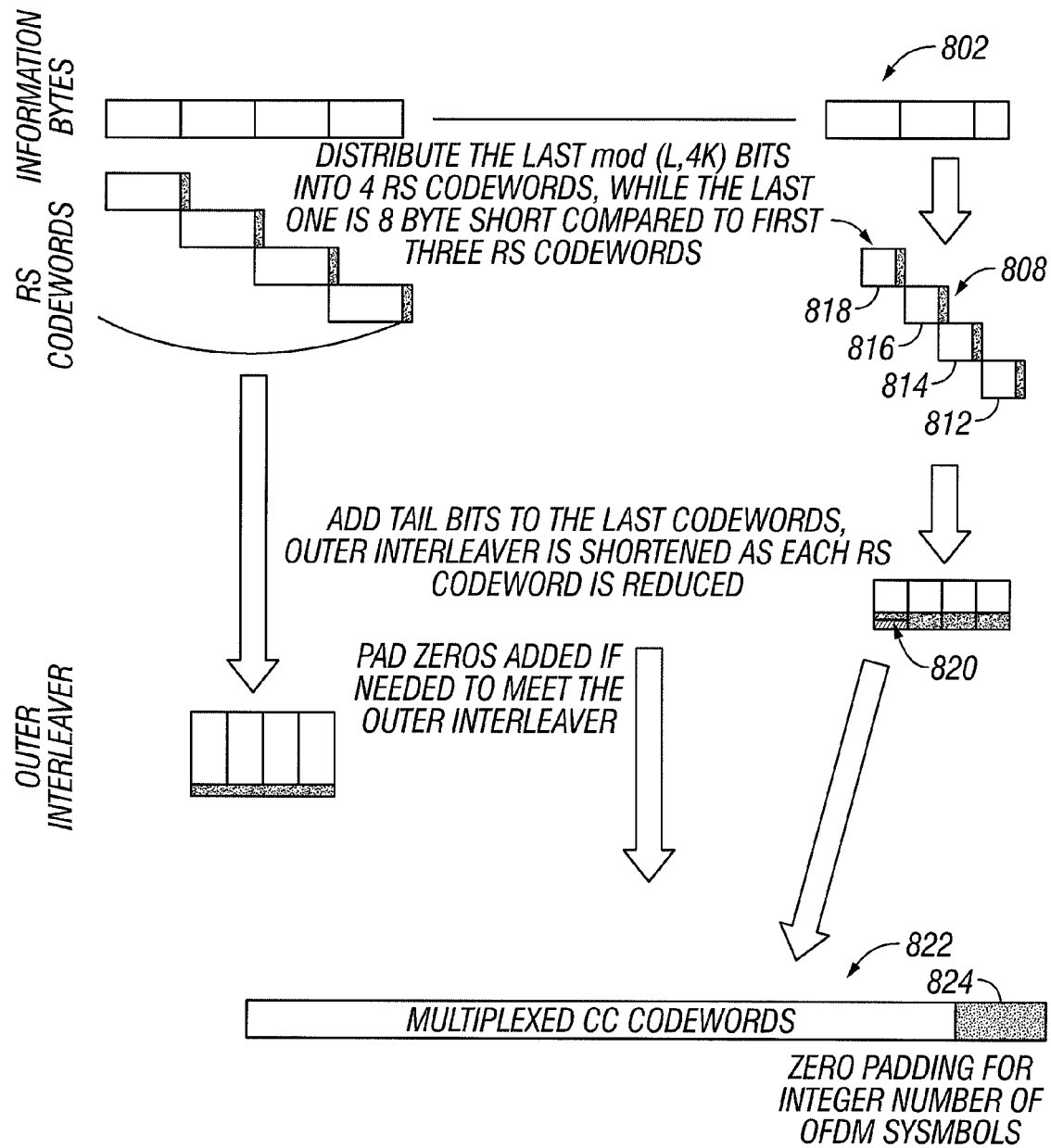
FIG. 10 illustrates a conceptual diagram showing an encoding procedure of a HD video data transmitter for a WVAN according to another embodiment of the invention.
Figure 11:
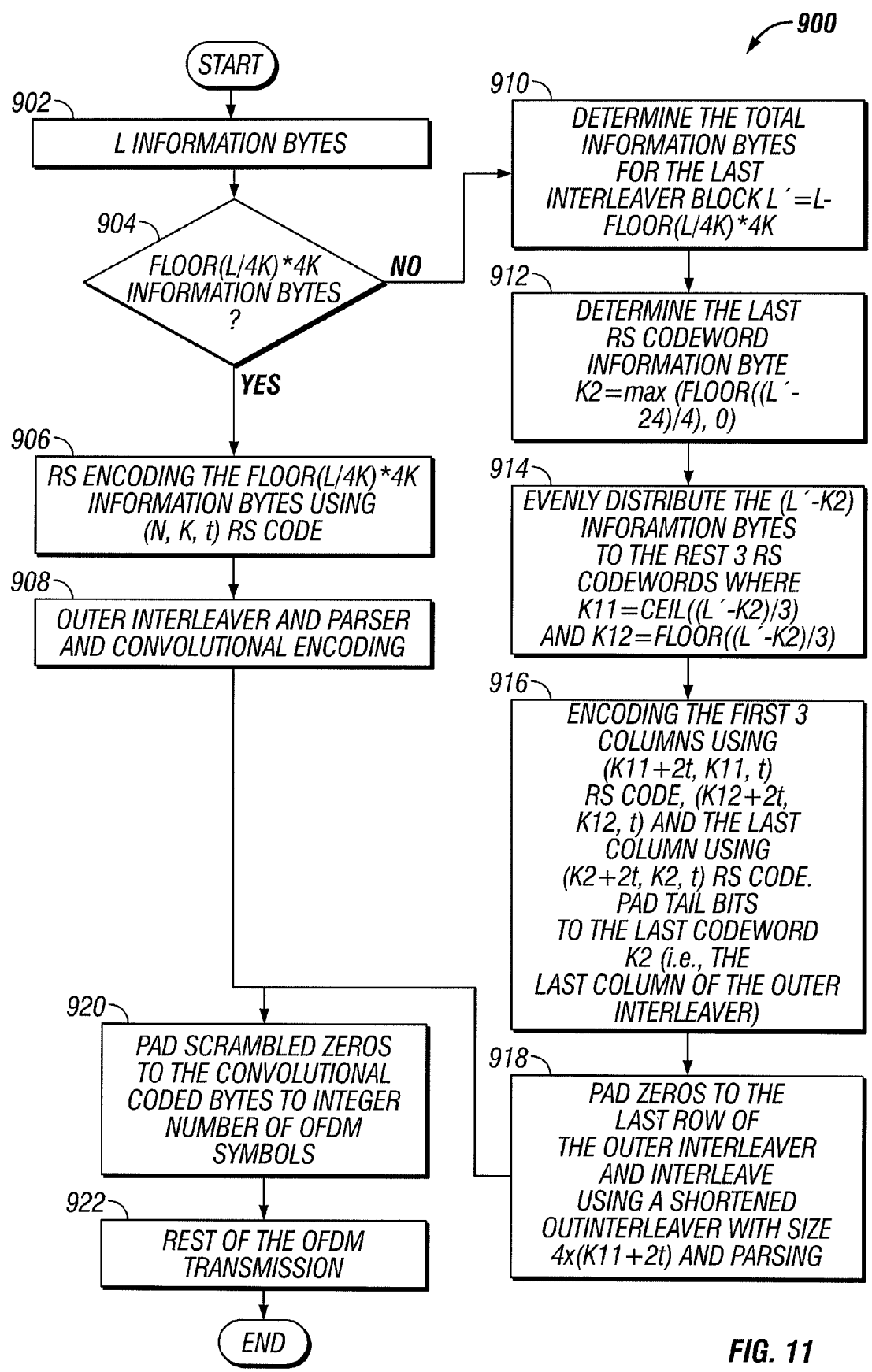
FIG. 11 is an exemplary flowchart for the encoding procedure according to another embodiment of the invention.

FIG. 10 illustrates a conceptual diagram showing an encoding procedure 900 (see FIG. 11) of a HD video data transmitter for a WVAN according to another embodiment of the invention. FIG. 11 is an exemplary flowchart for the encoding procedure 900 according to another embodiment of the invention. Referring to FIGS. 3 and 10-11, the operation of the scheme 4 encoding procedure will be described in greater detail. States 902-908 of FIG. 11 are substantially the same as states 702-708 of FIG. 9. Furthermore, states 920-922 of FIG. 11 are substantially the same as states 718 and 720 of FIG. 9.

The system 300 determines the value of "L'=L−floor(L/4K)×4K", where K represents an RS code length (910). This state is also substantially the same as part of state 704 of FIG. 9. L' 802 represents remainder bytes or the total information bytes for the last interleaver block.

The system 300 determines an RS code for the last RS codeword byte K2 (816), for example, using the equation: K2=max (floor ((L'−24)/4), 0) (912). In state 914, the system 300 evenly distributes the (L'−K2) information bytes to the rest of three RS codewords 812-816, where K11 is for the first two codewords 812, 814 and K12 is for the third codeword 816. In one embodiment, K11 is obtained by using the equation "K11=ceil ((L'−K2)/3)" and K12 is obtained by using the equation "K12=floor ((L'−K2)/3)."

The first two codewords 812, 814 are encoded with, for example, an RS code (K11+2t, K11, t) and the third codeword 816 is encoded with, for example, an RS code (K12+2t, K11, t) (916). The last codeword 818 is encoded with, for example, an RS code (K2+2t, K2, t) (916). Thereafter, if needed, tail bits 820 may be added to the last codeword (818) in order to meet the size requirement of the RS encoder (916).

In order to meet the size requirement of the outer interleaver, the system 300 may add zero bytes to the outer interleaver and outer interleave the RS encoded data using a shortened outer interleaver with the size of 4×(K11+2t) (918). Thereafter, parsing is performed to parse the outer interleaved data to convolutional encoders. In one embodiment, states 904 and 910-914 may be performed by at least one of the RS encoders 304, 306. In another embodiment, states 904 and 910-914 may be performed by another element of the FIG. 3 system or a separate element which is not shown in FIG. 3.

In this scheme 4, the remainder bytes 802 are converted into four shortened codewords 812-818, where the last codeword 818 is, for example, eight bytes shorter than the remaining codewords 812-816 as shown in FIG. 10. For example, if L'=32, then K2=2 for the last codeword, and K1 (=K11=K12) =10 for the first three codewords in the depth four outer interleaver. So, the difference between K2 and K1 is 8 bytes. 8 bytes of tail bits are added to the last codeword 818 and 8 bytes of parity bits are added to each of the first to third codewords 812-816. In this example, the shortened outer interleaver would have the size of 4×(K11+2t)=4×(10+8)=4× 18 bytes which provides a significantly higher efficiency compared to the outer interleaver having the size of 4×224 bytes.

Figure 12A:
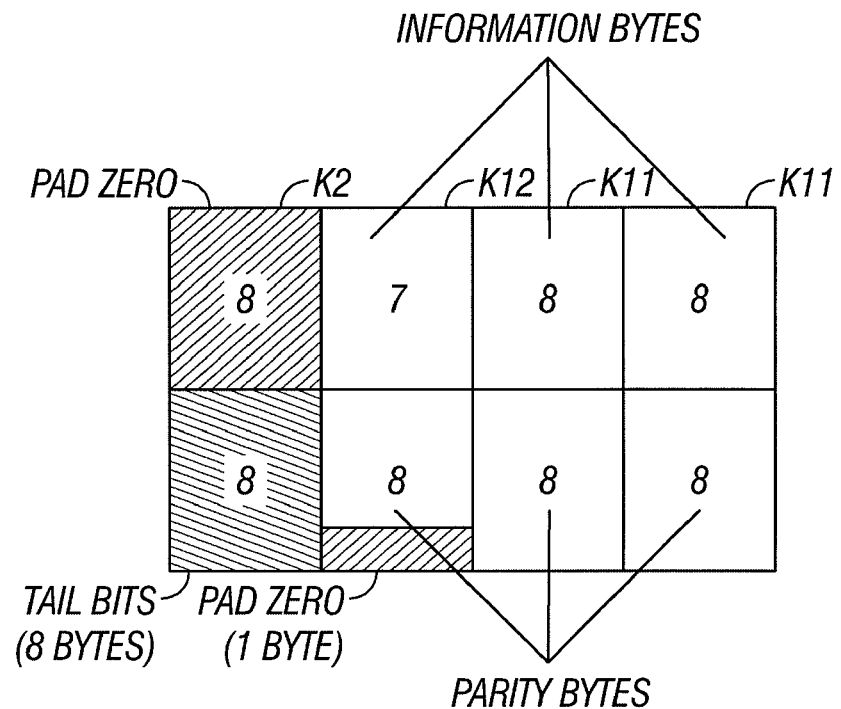
FIG. 12A illustrates a conceptual drawing of an interleaver for the remainder codewords according to one embodiment.

The procedure 900 will be further explained with reference to FIG. 12A. FIG. 12A illustrates a conceptual drawing of an interleaver for the remainder codewords according to one embodiment. It is assumed that the number (L') of the remainder codewords is 23 bytes. In state 912, K2=max(floor((L'−24)/4), 0)=max(floor((23−24)/4), 0)=0. In state 914, K11=ceil((L'−K2)/3=Ceil(23−0)/3=8. Also, K12=floor((L'−K2)/3=floor(23−0)/3=7. The first to third (information) codewords are 8, 8 and 7, respectively, as shown in FIG. 12A. The fourth codeword is 0 as shown in FIG. 12A. In state 916, 8 bytes of tail bits are added to the fourth codeword as shown in FIG. 12A (state 916). In state 918, 1 byte of zeros is padded to the third codeword and 8 bytes of zeros are padded to the fourth codeword as shown in FIG. 12A (state 918). In this example, the shortened outer interleaver has the size of 4×16 bytes as shown in FIG. 12A which provides a significantly higher efficiency compared to the outer interleaver having the size of 4×224 bytes.

Alternative Embodiment

Modified Version of Scheme 4

Figure 12B:
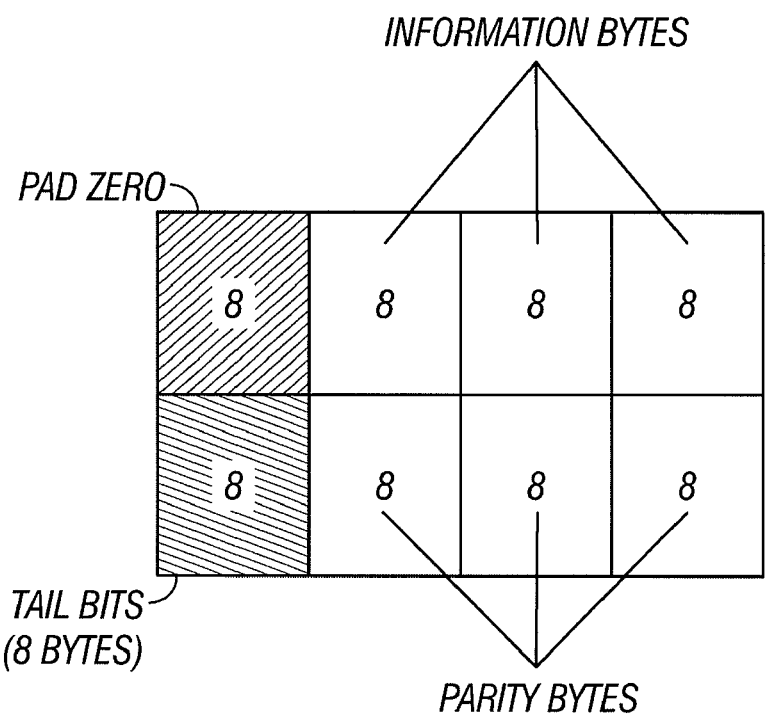
FIG. 12B illustrates a conceptual drawing of an interleaver for the remainder codewords according to another embodiment.

In another embodiment, the information bytes are padded to multiple of four instead of using the ceil/floor operation to calculate K11 and K12 as shown in FIG. 12B. FIG. 12B illustrates a conceptual drawing of an interleaver for the remainder codewords according to another embodiment. In this embodiment, the encoding can be described as following:

Zeros are padded to the L1 information bytes to obtain L2=max{(depth−1)×M, ceil(L1/depth)×depth}. Assuming that L1=23 bytes and depth=4 and M=8, L2=max{(depth−1)×M, ceil(L1/depth)×depth}=max{(4−1)×8, ceil(23/4)×4}=max {24,20}=24.

The length (K2) of the last RS codeword is calculated: K2=max{[L2−(depth−1)×M]/depth, 0}=max{[24−(4−1)× 8]/4, 0}=max{0,0}=0. The length (K1=K11=K12) of the remaining RS codewords is calculated: K1=(L2−K2)/(depth−1)=(24−0)/(4−1)=8. This is illustrated in FIG. 12B.

The i=depth−1 column of the outer interleaver is a shortened RS (K2+2×t, K2, t=4) code. The i=0, 1, . . . depth −2 column of the outer interleaver is a shortened RS (K1+2×t, K2, t=4) code. The bytes of b(depth−1, K2+2×t+1), . . . , b(depth−1, K1+2×t) are padded with zeroes. A shortened block interleaver for RS(K1+2×t, K2, t=4) is used similar as in the scheme 4 example. FIG. 12B shows that 8 bytes of zeros are padded to the last codeword and 8 bytes of tail bits are added to the last codeword, and 8 bytes of parity bits are added to each of the first to third codewords. In this example, the shortened outer interleaver has the size of 4×16 bytes as shown in FIG. 12B which provides a significantly higher efficiency compared to the outer interleaver having the size of 4×224 bytes.

In another embodiment, the information bytes can be padded further to meet other system requirements, for example, the bit interleaver requirement. The method of encoding the information bytes together with the padded bits follows the same as described above.

According to at least one embodiment, the method of encoding the information bits is intended to meet the RS codeword boundary, the block outer interleaver boundary and OFDM symbol boundary. Different schemes are provided which give different tradeoffs between simplicity and RS codeword performance, and the padding efficiency. At least one embodiment of the invention provides much more efficient padding schemes while improving the decoding performance. Furthermore, at least one embodiment of the invention does not require changes to current designs, either. At least one embodiment of the invention can be applicable to other wireless telecommunication standards such as IEEE 802.15.3c.

While the above description has pointed out novel features of the invention as applied to various embodiments, the skilled person will understand that various omissions, substitutions, and changes in the form and details of the device or process illustrated may be made without departing from the scope of the invention. For example, although embodiments of the invention have been described with reference to uncompressed video data, those embodiments can be applied to compressed video data as well.

Therefore, the scope of the invention is defined by the appended claims rather than the foregoing description. All variations coming within the meaning and range of equivalency of the claims are embraced within their scope.

What is claimed is:

1. A method of processing high definition video data to be transmitted over a wireless medium, the method comprising:
    in a physical layer, receiving an information packet having the length of L bytes, wherein L=(M×n×K)+A, and where:
    M is the depth of an interleaver,
    n is the number of interleavers,
    K is an encoding code length and
    A is the number of remainder bytes with respect to M×n×K bytes,
    wherein the remainder bytes are located at the end of the information packet, and
    wherein M×n×K bytes represent M×n codewords; and
    converting the A remainder bytes into a plurality of shortened codewords, wherein each of the shortened codewords is shorter in length than each of the M×n codewords.

2. The method of claim 1, wherein the plurality of shortened codewords have a last codeword which is shorter than the remaining shortened codewords.

3. The method of claim 2, wherein the last codeword is 8 bytes shorter than the remaining shortened codewords.

4. The method of claim 1, wherein the plurality of shortened codewords have the same codeword in length.

5. The method of claim 1, further comprising:
    outer encoding the M×n codewords and the plurality of shortened codewords based on the code length (K);
    outer interleaving the M×n codewords and the plurality of outer encoded shortened codewords;
    inner encoding the outer interleaved codewords; and multiplexing the inner encoded data.

6. The method of claim 5, further comprising padding zeros to the inner encoded data so as to meet a predefined size requirement for the outer interleaver.

7. The method of claim 6, further comprising adding tail bits to the last codeword so that the length of the last codeword is the same as those of the remaining shortened codewords.

8. The method of claim 5, wherein the outer encoding comprises Reed Solomon (RS) encoding and the inner encoding comprises convolutional encoding.

9. The method of claim 8, further comprising padding zeros to the convolutional encoded data such that the convolutional encoded data has an integer number of orthogonal frequency division multiplexing (OFDM) symbols.

10. The method of claim 1, further comprising shortening the size of the outer interleaver for the remainder bytes in proportion to the shortening of the codewords.

11. A system for processing high definition video data to be transmitted over a wireless medium, the system comprising:
a first module configured to receive an information packet having the length of L bytes, wherein L=(M×n×K)+A, and where:
M is the depth of an interleaver,
n is the number of interleavers,
K is an encoding code length and
A is the number of remainder bytes with respect to M×n×K bytes,
wherein the remainder bytes are located at the end of the information packet, and wherein M×n×K bytes represent M×n codewords;
a second module configured to convert the A remainder bytes into a plurality of shortened codewords, wherein each of the shortened codewords is shorter in length than each of the M×n codewords; and
a processor cooperatively arranged with the first and second modules so as to process the bytes accordingly.

12. The system of claim 11, wherein the first module is configured to add tail bits to the last codeword so that the length of the last codeword is the same as those of the remaining shortened codewords.

13. The system of claim 11, further comprising:
an outer interleaver configured to outer interleave the M×n codewords and the plurality of RS encoded shortened codewords with the tail bits added;
an inner encoder configured to inner encode the outer interleaved codewords; and
a multiplexer configured to multiplex the inner encoded data.

14. The system of claim 13, wherein the outer interleaver comprises:
a first plurality of sub-outer interleavers configured to outer interleave the M×n codewords, respectively; and
a second sub-outer interleaver configured to outer interleave the plurality of RS encoded shortened codewords,
wherein the size of the second sub-outer interleaver is significantly less than that of each of the first plurality of sub-outer interleavers.

15. The system of claim 14, wherein the size of the second sub-outer interleaver is 4×(K1+2t), where K1=ceil (A/4) and t is error correction capability (bytes).

16. A method of processing high definition video data to be transmitted over a wireless medium, the method comprising:
a hardware processor coupled with at least one outer interleaver, wherein each of the at least one outer interleaver has a depth of M, and wherein the depth represents the number of columns of each outer interleaver;
receiving an information packet having the length of L bytes, wherein L=(M×n×K)+A, wherein n=0, 1, 2, 3, ... and n represents the number of the at least one outer interleaver, wherein K represents an Reed Solomon (RS) code length, wherein A=1, 2, 3, ... K−1 and A represents the number of remainder bytes with respect to M×n×K bytes,
wherein the remainder bytes are located at the end of the information packet, and wherein M×n×K bytes represent M×n codewords;
converting the A remainder bytes into four shortened codewords, wherein each of the shortened codewords is shorter in length than each of the M×n codewords, wherein the four shortened codewords comprise a last codeword, and wherein the last codeword is 8 bytes shorter in length than the remaining three shortened codewords;
RS encoding the plurality of shortened codewords based on the RS code length (K);
adding tail bits to the last codeword so that the length of the last codeword is the same as those of the remaining shortened codewords; and
outer interleaving the plurality of RS encoded shortened codewords with the tail bits added.

17. The method of claim 16, further comprising:
outer interleaving the M×n codewords; and
convolutional encoding the outer interleaved M×n codewords and shortened codewords.

18. The method of claim 17, further comprising padding zeros to the convolutional encoded data such that the convolutional encoded data has an integer number of orthogonal frequency division multiplexing (OFDM) symbols.

19. The method of claim 17, further comprising:
multiplexing the convolutional encoded data; and
padding zeros to the multiplexed data so as to meet a predefined size requirement for a bit interleaver.

20. The method of claim 19, wherein M=4 and K=216 and wherein the RS encoding comprises:
determining an RS code parameter (K2) for the last codeword, wherein K2=max (floor (L'−24/4), 0), and wherein L'=L−floor (L/864)×864;
determining an RS code parameter (K12) for the third codeword, wherein K12=floor ((L'−K2)/3);
determining an RS code parameter (K11) for the first and second codewords, wherein K11=ceil ((L'−K2)/3);
RS encoding the first and second shortened codewords with an RS code (K11+2t, K11, t);
RS encoding the third shortened codeword with an RS code (K12+2t, K12, t); and
RS encoding the last shortened codeword with an RS code (K2+2t, K2, t).

21. A system for processing high definition video data to be transmitted over a wireless medium, the system comprising:
at least one first outer interleaver, wherein each of the at least one first outer interleaver has a depth of M, and wherein the depth represents the number of columns of each outer interleaver;
a first module configured to receive an information packet having the length of L bytes, wherein L=(M×n×K)+A, wherein n=0, 1, 2, 3, ... and n represents the number of the at least one first outer interleaver, wherein K represents an Reed Solomon (RS) code length, wherein A=1, 2, 3, ... K−1 and A represents the number of remainder bytes with respect to M×n×K bytes, wherein the remainder bytes are located at the end of the information packet, and wherein M×n×K bytes represent M×n codewords;
a second module configured to convert the A remainder bytes into four shortened codewords, wherein each of the shortened codewords is shorter in length than each of the M×n codewords, wherein the four shortened codewords comprise a last codeword, and wherein the last codeword is 8 bytes shorter in length than the remaining three shortened codewords;
an RS encoder configured to RS encode the plurality of shortened codewords based on the RS code length (K);

a third module configured to add tail bits to the last codeword so that the length of the last codeword is the same as those of the remaining shortened codewords;

a second outer interleaver configured to outer interleave the plurality of RS encoded shortened codewords with the tail bits added; and a processor cooperatively arranged with the first, second and third modules so as to process the bytes accordingly.

22. The system of claim 21, wherein the first and second modules are integrated into the RS encoder.

23. The system of claim 21, wherein the third module is integrated into the second outer interleaver.

24. The system of claim 21, wherein the RS encoder is further configured to:

determine an RS code parameter (K2) for the last codeword, wherein K2=max (floor (L'−24/4), 0), and wherein L'=L−floor (L/864)×864;

determine an RS code parameter (K12) for the third codeword, wherein K12=floor ((L'−K2)/3);

determine an RS code parameter (K11) for the first and second codewords, wherein K11=ceil ((L'−K2)/3);

RS encode the first and second shortened codewords with an RS code (K11+2t, K11, t);

RS encode the third shortened codeword with an RS code (K12+2t, K12, t); and

RS encode the last shortened codeword with an RS code (K2+2t, K2, t).

25. A system for processing high definition video data to be transmitted over a wireless medium, the system comprising:

means for receiving an information packet having the length of L bytes, wherein L=(M×n×K)+A, and where:

M is the depth of an interleaver, n is the number of interleavers,

K is an encoding code length and

A is the number of remainder bytes with respect to M×n×K bytes, wherein the remainder bytes are located at the end of the information packet, and wherein M×n×K bytes represent M×n codewords; and means for converting the A remainder bytes into a plurality of shortened codewords, wherein each of the shortened codewords is shorter in length than each of the M×n codewords.

* * * * *